United States Patent
Heim

(10) Patent No.: US 6,787,935 B2
(45) Date of Patent: Sep. 7, 2004

(54) BATTERY SENSOR DEVICE

(75) Inventor: Andreas Heim, Landshut (DE)

(73) Assignee: Bayerische Motoren Werke Aktiengesellschaft, Munich (DE)

(*) Notice: Subject to any disclaimer, the term of this patent is extended or adjusted under 35 U.S.C. 154(b) by 38 days.

(21) Appl. No.: 10/168,023

(22) PCT Filed: Dec. 9, 2000

(86) PCT No.: PCT/EP00/12457

§ 371 (c)(1),
(2), (4) Date: Oct. 22, 2002

(87) PCT Pub. No.: WO01/44825

PCT Pub. Date: Jun. 21, 2001

(65) Prior Publication Data

US 2003/0057770 A1 Mar. 27, 2003

(30) Foreign Application Priority Data

Dec. 18, 1999 (DE) .......................................... 199 61 311

(51) Int. Cl.[7] .................................................. B60L 1/00
(52) U.S. Cl. ..................................................... 307/10.1
(58) Field of Search ................................ 320/105, 107, 320/104, 111, 113, 115, 150; 324/426

(56) References Cited

U.S. PATENT DOCUMENTS

| | | | |
|---|---|---|---|
| 4,572,878 A | 2/1986 | Daugherty | 429/62 |
| 4,675,255 A * | 6/1987 | Pfeifer et al. | 324/126 |
| 5,877,563 A | 3/1999 | Krappel et al. | 307/10.1 |
| 6,218,805 B1 * | 4/2001 | Melcher | 320/105 |

FOREIGN PATENT DOCUMENTS

| | | |
|---|---|---|
| DE | 3532044 A1 | 3/1987 |
| WO | WO 99/54744 | 10/1999 |

OTHER PUBLICATIONS

PCT Written Opinion, Form PCT/IPEA/408, with partial English translation.

PCT International Preliminary Examination Report, Forms PCT/IPEA/416 and PCT/IPEA/409, with partial English translation.

* cited by examiner

*Primary Examiner*—Pia Tibbits
(74) *Attorney, Agent, or Firm*—Crowell & Moring LLP

(57) ABSTRACT

A battery sensor device has a fastening device that can be directly fastened to the pole of a vehicle battery. The battery sensor and the fastening device are combined to an integrated component. The fastening device is fastened to a single pole only and is provided with a terminal that is conventional in motor vehicles. Alternatively or additionally, the component is adapted to conventional battery pole troughs as regards its shape and size.

14 Claims, 3 Drawing Sheets

BATTERY SENSOR DEVICE

BACKGROUND AND SUMMARY OF THE INVENTION

This invention relates to a battery sensor arrangement.

A battery sensor arrangement is known, for example, from U.S. Pat. No. 5,939,861. In this known arrangement, the battery sensor is arranged in an indentation in a battery lid provided specifically for this battery sensor and has to be fastened to both poles of the battery.

Diverse arrangements and methods are known for monitoring, control, and automatic control of a motor vehicle wiring system; such arrangements and methods include energy distribution, energy control, and, particularly, load balancing of batteries. According to the application, normally, at least the measurable variables of battery current, battery voltage, and battery temperature are required. For sensing the battery current, sensors are normally used in the connection line to the battery. The battery voltage and the battery temperature are usually measured by separate sensors directly at or away from the battery poles. Therefore, according to the prior art, three completely independent devices are normally used. A separate installation space has to be created for the devices in each vehicle, and information for the devices has to be transmitted for further processing, usually to higher ranking control units.

With respect to the broader technical background concerning battery sensor arrangements, reference is made to German Patent Document DE 35 32 044 A1 and to International Patent Document WO 99/54744 A1.

It is an object of the invention to improve a battery sensor of the initially mentioned type such that installation costs and logic-related expenditures are reduced, and measuring precision is increased.

This object is achieved according to the invention.

By way of the invention, an integrated battery sensor is created which can be installed in any vehicle with only a few additional expenditures while the required installation space is small. In addition, as a result of the compact structural shape and the integration of several necessary components, the failure probability is reduced.

The drawings show the invention.

BRIEF DESCRIPTION OF THE DRAWINGS

FIG. 1b is a sectional view along line B—B of FIG. 1a;

FIG. 5b is a view of a construction slightly modified from that of FIG. 5a;

DETAILED DESCRIPTION OF THE INVENTION

Figure 1A:
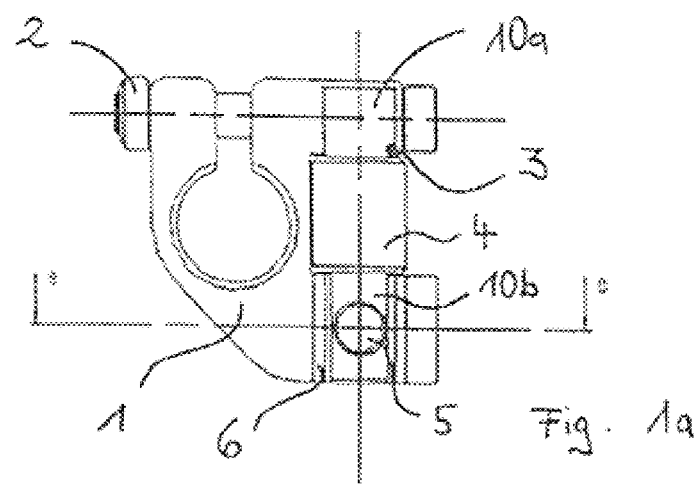
FIG. 1a is a top view of a first possible design of an integrated constructional unit according to the invention having a battery sensor and a fastening device in a two-dimensional representation.

FIG. 1a shows the fastening device of the battery sensor preferably as a conventional battery brass clamp having a clamp body 1 and a clamping screw 2. The battery sensor 3, 4 is constructed essentially of a measuring shunt 3 and of an electronic unit 4. FIG. 1a shows only the two resistance connections (10a, 10b; compare also FIG. 2) of the measuring shunt 3, which are constructed as mechanical carriers, and a sprayed plastic material around the electronic unit 4. According to the invention, the battery sensor 3, 4 and the fastening device 1, 2 are combined into an integrated structural unit. The fastening device 1, 2 has to be connected only to a single pole of a battery, for example, to the minus pole. The structural unit, including the fastening device 1, 2 and the battery sensor 3, 4, is adapted with respect to its shape and size to the known battery pole trough (not separately shown here) specified according to Polish DIN 72311 (Part 15).

The first resistance connection 10a illustrated in FIG. 1a at the top is conductive; the second resistance connection 10b illustrated in FIG. 1a at the bottom is fastened, in an insulating manner by way of an insulation part 6, to the clamp body 1. At the second resistance connection 10b, the cable socket of a conventional connection cable can be connected, for example, by way of a screw 5 and a screw nut 7 (compare FIG. 1b) embedded in the insulation part 6. In the present embodiment, in which the clamp 1, 2 is to be connected to the minus pole of the battery, the connection cable (not illustrated here) connects the output-side resistance connection 10b of the measuring shunt 3 with the vehicle body mass.

Figure 1B:
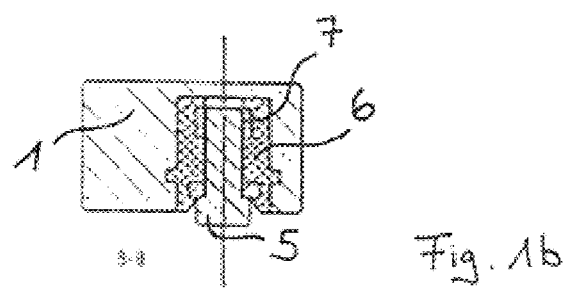
Figure 2:
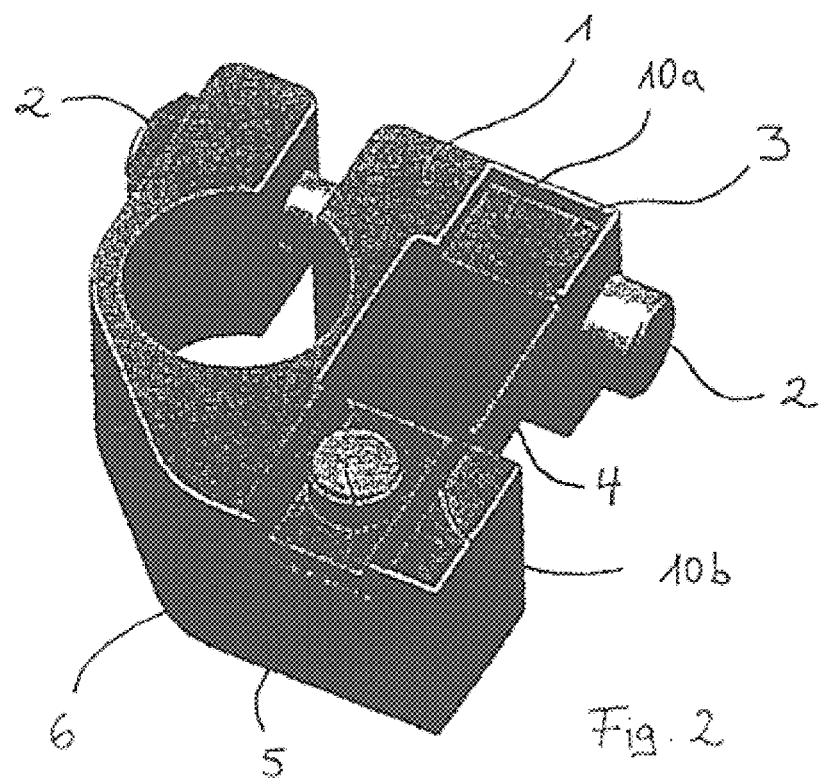
FIG. 2 is a three-dimensional representation of a first possible construction of the integrated structural unit according to the invention having the battery sensor and the fastening device.

For explaining the invention, FIG. 2 represents a three-dimensional view of the structural unit illustrated in FIGS. 1a and 1b. Identical components have the same reference numbers.

Figure 3:
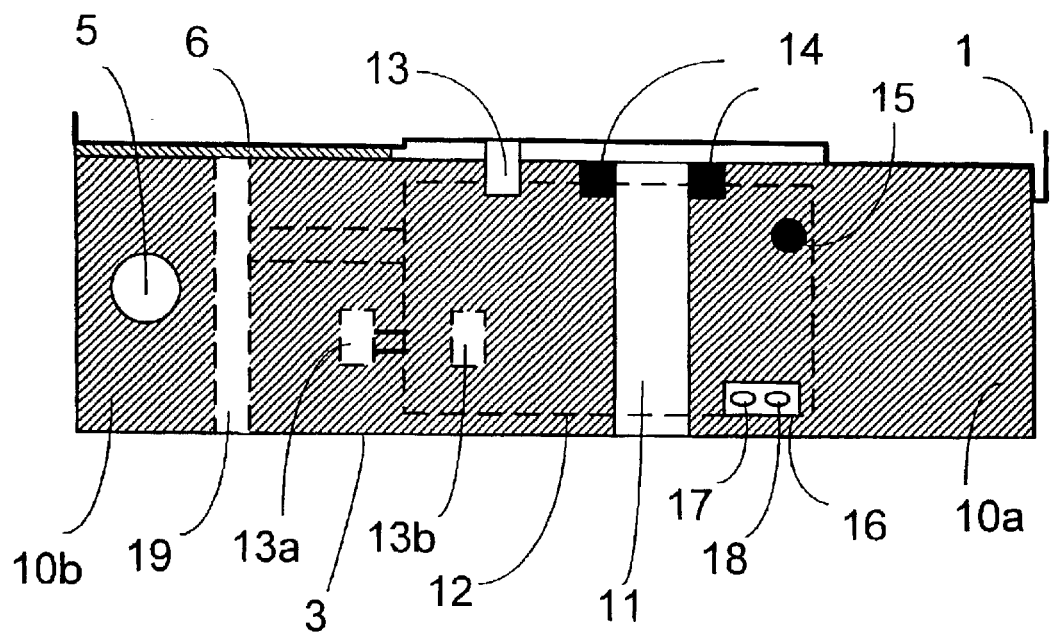
FIG. 3 is a more precise schematic representation of the battery sensor having a measuring shunt and an electronic unit.

FIG. 3 essentially illustrates the details of the measuring shunt 3, possible arrangements of a temperature sensor 13, 13a, or 13b, and a possible connection of these components with the electronic unit 4. The measuring shunt 3 has a resistance element 11 and two planar resistance connections 10a and 10b. The resistance connections 10a and 10b preferably are copper surfaces of a stable construction. The material of the resistance element 1 preferably is manganin, zeranin or isaohm. Copper and manganin/zeranin/isaohm have approximately the same temperature coefficient of expansion as the conventional board material FR4 (mixed material with epoxy resin as the main constituent). This board material is preferably also used for the carrier board 12 of the electronic unit 4, which is shown in FIG. 3 without the sprayed-around plastic material. The carrier board 12 of the electronic unit 4 according to FIG. 3 can therefore be fastened, similar to SMD-technology, by way of mere soldering points 14 to the resistance connections 10a and 10b. As an alternative, the carrier board 12 can also be fastened in a conductive manner by way of short scythe-type lines bent upward by 90° of the transmission connections 10a and 10b to the measuring shunt 3. The soldering points 14 or the connections of the scythe-type lines are arranged as closely as possible to the resistance element 11. By way of the soldering points 14, the resistance element 11 is integrated with respect to the circuit into the electronic unit 4.

The electronic unit 4 or the carrier board 12 is connected in FIG. 3 with a temperature sensor 13 for measuring the battery temperature. Alternative arrangements of the temperature sensor are shown by broken lines indicated by reference numbers 13a and 13b. In a heat-conducting manner, the temperature sensor 13 is arranged directly on the clamp body 1, for example, by way of a heat-conducting bonding agent. This arrangement permits a very precise temperature measurement but requires slightly higher expenditures than the arrangement of the temperature sensors 13a and 13b which are mounted in a heat-conducting manner on the resistance connection 10b. In a simplified fashion, the temperature sensor 13a is connected with the carrier board 12 by way of connection wires. The temperature sensor 13b is connected with the carrier board 12, for example, by way of soldering points in order to prevent the connection wires. However, a recess in the carrier board 12 may be required for the temperature sensor 13b.

The electronic unit or the carrier board 12 has, for example, a two-pole connector 16. A supply cable to the other pole of the battery, here the plus pole, can be connected to the pin 18 of the connector 16. For example, a bidirectional communication line to other electronic equipment in the motor vehicle can be connected to the pin 17 of the connector 16. As an alternative, the communication line may also require two pins (for example, when a CAN-bus is used). In a third alternative, the communication can, however, also take place per radio transmission. For reasons of space, instead of a connection by way of a connector 16, a direct connection of the connection lines with the board may also be provided (for example, by soldering, bonding or welding). The alternatives are not shown here.

Figure 4:
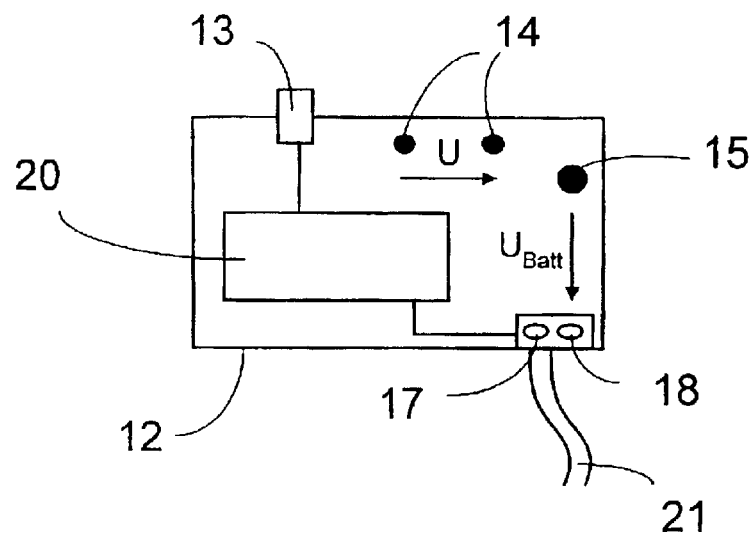
FIG. 4 is a more precise schematic representation of the electronic unit.

Finally, FIGS. 3 and 4 show a first voltage tap 15 for measuring the battery voltage $U_{batt}$ which is connected in a conductive manner with the battery-pole-side (for example, to the minus pole) resistance connection 10a. The second voltage tap for measuring the battery voltage $U_{batt}$ is formed by the pin 18 (for example, to the plus pole of the battery).

FIG. 4 shows additional details of the carrier board 12 or of the electronic unit 4. The carrier board 12 or the electronic unit 4 has a measuring, analyzing and control unit 20. The unit 20 detects the battery voltage $U_{batt}$, the voltage U between the two soldering points 14 and the battery temperature. The battery current (I) can be computed from the voltage U. For this purpose, for example, the resistance value (R) of the resistance element 11 is stored in the unit 20. The unit 20 preferably has a microprocessor and a memory. The unit 20 may also contain conventional amplifiers and A/D analog-to-digital converters for measurement processing. The unit 20 may determine arbitrary additional battery indicator quantities, such as the charge condition or the aging. Furthermore, by way of the communication line, the unit 20 itself can not only transmit information but can also receive additional information from other equipment and further process this information together with the battery quantities. The communication line and the supply line to the connector 16 are illustrated in a combined manner as a cable tree 21.

As a function of the information available to the unit 20, this unit can control a power switch 19 which can close or open an interruption present in the resistance connection 10b. In this case, the battery supply of the motor vehicle can be switched off, for example, in the event of emergencies. As an alternative thereto, the power switch 19 can also be integrated in one of the two connection cables to the plus pole or to the minus pole of the battery and can be controlled by the unit 20.

Figure 5A:
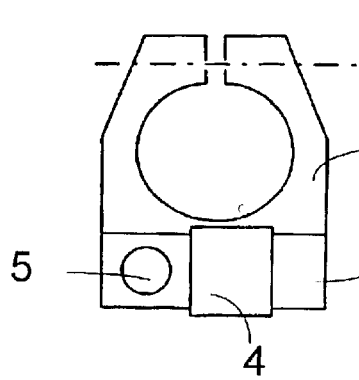
FIG. 5a is a two-dimensional schematic representation of a second possible construction of the integrated structural unit according to the invention having a battery sensor and a fastening device.

In a supplementary manner, FIG. 5a shows only schematically a second possible construction of the integrated unit according to the invention consisting of the battery sensor and the fastening device. In this case, the dash-dotted line indicates the bore for the clamping screw 2. This construction deviates from the first construction only in that locally the battery sensor 3, 4 is more set off from the clamping screw 2 and is thereby uncoupled from possible bracing during fastening of the clamp body 1.

Figure 5B:
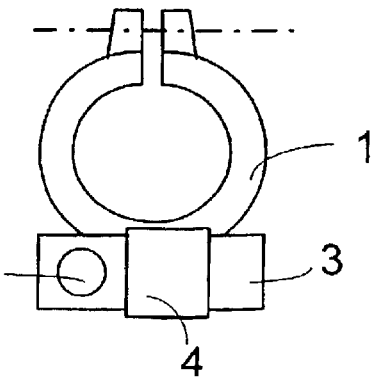

FIG. 5b illustrates a construction which is very similar to FIG. 5a but in which tapering is provided between the clamp body 1 and the measuring shunt 3 in order to avoid tensions in the clamp body 1.

FIGS. 6a to 7b show further development possibilities of the measuring shunt 3 with the resistance element 11 and the two resistance connections 10a and 10b as well as the fastening of the electronic unit 4 or its carrier board 12. The resistance connections 10a and 10b preferably (as in FIG. 3) are copper surfaces of planar construction. The material of the resistance element 1, preferably manganin or zeranin, is arranged, as in FIG. 3, between the resistance elements 10a and 10b.

In FIGS. 6a to 7b, the carrier board 12 of the electronic unit 4 (also similar to SMD-technology) is fastened by way of soldering points 14 to the resistance connections 10a and 10b. Here, the soldering points 14 form a long drawn-out line along the edge of the carrier board 12 in FIG. 6a (and in FIG. 7a, which is a lateral view of the structure of FIG. 6a). For this purpose, at least partially open conducting tracks for the soldering points are provided preferably at the edges of the carrier board. The soldering lines 14 may also be interrupted or be composed of spaced points. The further development according to FIG. 6a (or FIG. 7a) requires that the width of the carrier board 12 is not much larger than the width of the resistance element 11. The reason is that soldering has to be provided as close as possible to the resistance element 11. In this case, the construction of the measuring shunt according to FIG. 7a is preferably such that a hollow space is created between the resistance element 11 and the carrier board 12. The thickness of the resistance element 11 is therefore smaller than that of the resistance connections 10a and 10b. As a result of this hollow space, it is possible to equip this carrier board 12 on both sides, if required.

Figure 6A:
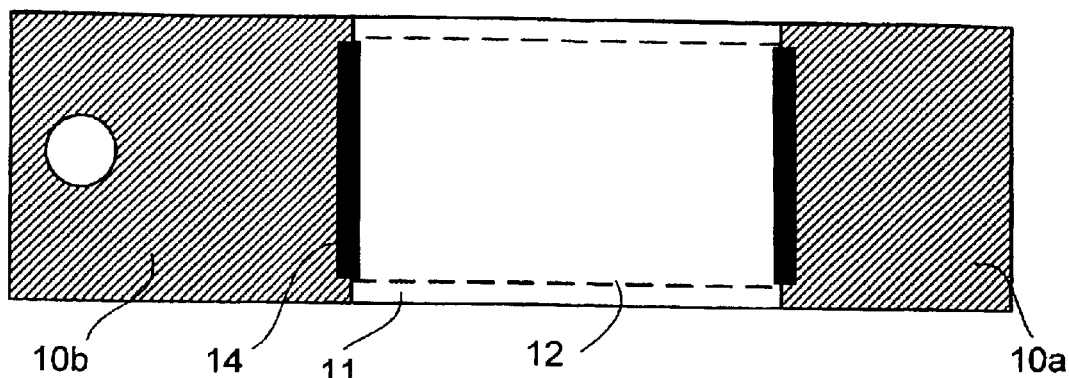
FIGS. 6a and 6b are views of additional possible ways for fastening the electronic unit on the measuring shunt.
Figure 6B:
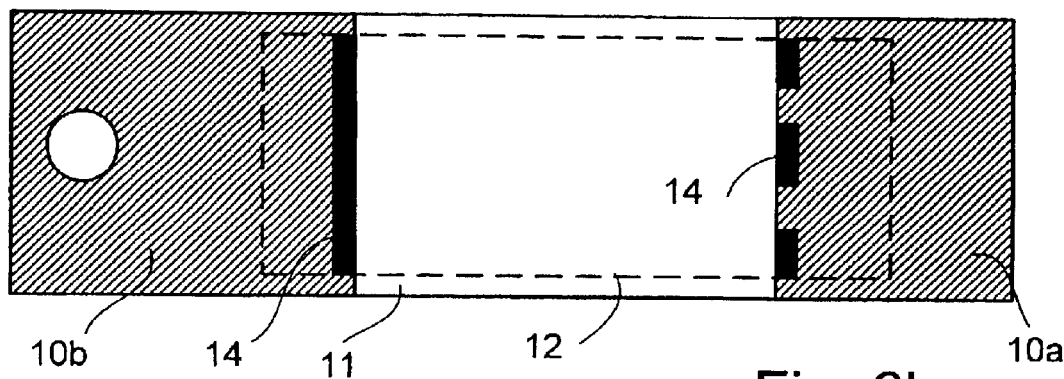
Figure 7A:
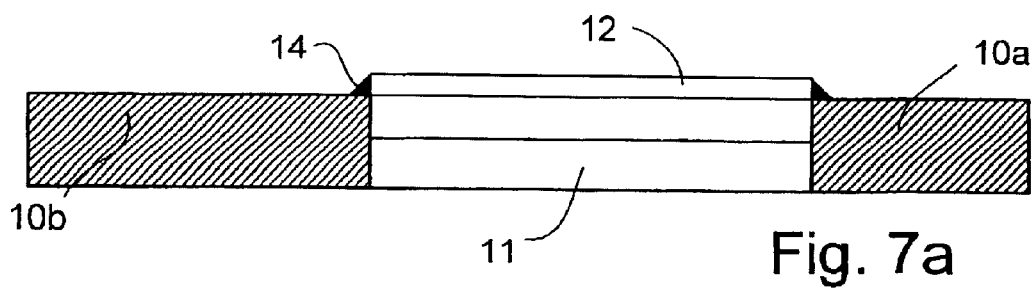
FIG. 7a is a view of a further development of the measuring shunt.
Figure 7B:
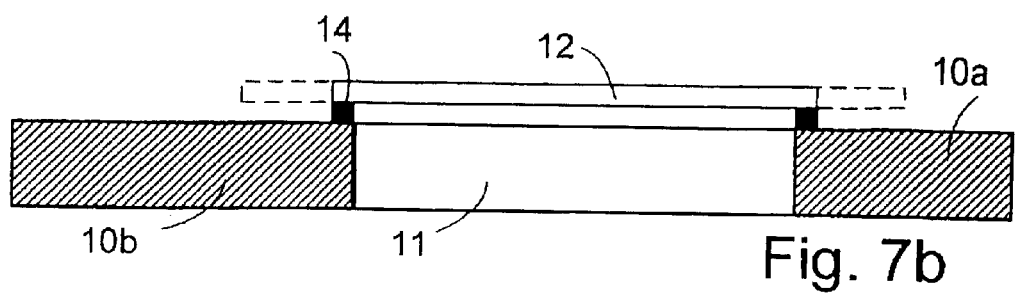
FIG. 7b is a view of another further development of the measuring shunt.

As an alternative, according to FIG. 6b (and FIG. 7b, which is a lateral view of the structure of FIG. 6b), the carrier board 12 can also be connected as closely as possible with the resistance element 11 (similar to FIG. 3) by soldering points 14 at the bottom side of the board 12. In contrast to FIG. 3, in this case, a solid (FIG. 6b, left) or a broken (FIG. 6, right) soldering line is provided for mechanical stabilization (as in FIG. 6a). By way of the soldering points 14, the resistance element 11 is always also integrated in the electronic unit with respect to the circuit. The further development according to FIG. 6b may be combined with the construction of the measuring shunt according to FIG. 7a or 7b. If equipping of the underside of the carrier board 12 is not required, a construction according to FIG. 7b will be possible. In this case, no hollow space is provided between the resistance element 11 and the carrier board 12. In a further development according to FIG. 6b and FIG. 7b, the width of the carrier board 12 may also be larger than the width of the resistance element 11.

In each further development, bonding points 14 produced, for example, by an electrically conductive heat conducting bonding agent, can be provided instead of soldering points 14.

In principle, according to the invention, the electronic unit 4 or the carrier board 12 of the electronic unit 4 is fastened to the planar resistance connections 10a and 10b by an electrically conducting material 14 (such as a solder or a bonding agent). The soldering points or bonding points 14 are therefore used for the electric or circuit-related integration of the measuring shunt or of the resistance element 11 into the electronic unit 4 as well as for the mechanical fastening of the electronic unit 4 or its carrier board 12 to the measuring shunt or to its resistance connections 10a and 10b.

What is claimed is:

1. A battery sensor arrangement comprising:
   a fastening device which can be connected directly to a pole of a battery, and
   a battery sensor combined with the fastening device into an integrated structural unit,
   wherein the fastening device is connected only to a single pole of the battery,
   wherein the fastening device has a clamp which is conventional for a battery connection cable,
   wherein the battery sensor has a planar measuring shunt and an electronic unit,
   wherein the measuring shunt is a resistance element with two resistance connections constructed as mechanical carriers,
   wherein the electronic unit is fastened to the resistance connections, and
   wherein the resistance element is integrated in the electronic unit in a circuit-related manner.

2. A battery sensor arrangement comprising:
   a fastening device which can be connected directly to a pole of a battery, and
   a battery sensor combined with the fastening device into an integrated structural unit,
   wherein the fastening device is connected only to a single pole of the battery,
   wherein the fastening device has a clamp which is conventional for a battery connection cable,
   wherein the battery sensor has a planar measuring shunt and an electronic unit,
   wherein the measuring shunt is a resistance element with two planar resistance connections constructed as mechanical carriers, and
   wherein the electronic unit or a carrier board of the electronic unit is fastened to the planar resistance connections by an electrically conducting material.

3. The battery sensor arrangement according to claim 1, wherein the battery sensor is fastened, by way of a first of said resistance connections in a conducting manner and by way of a second of said resistance connections in an insulating manner, to a body of the clamp, and wherein a connection cable can be connected to the second of said resistance connections.

4. The battery sensor arrangement according to claim 1, wherein the electronic unit is connected with a temperature sensor which is arranged in a heat-conducting manner on a resistance connection or directly on a body of the clamp.

5. The battery sensor arrangement according to claim 1, wherein the electronic unit has a connector to which at least one supply cable to the other pole of the battery can be connected.

6. The battery sensor arrangement according to claim 1, wherein the electronic unit has a connector to which at least one communication line to other electronic equipment can be connected.

7. The battery sensor arrangement according to claim 1, wherein the electronic unit has a unit which determines at least one of a battery voltage, a battery current, and a battery temperature.

8. The battery sensor arrangement according to claim 7, and further comprising a resistance connection which has an interruption which can be closed by way of a power switch, wherein the power switch can be controlled by the unit which determines at least one of a battery voltage, a battery current, and a battery temperature.

9. The battery sensor arrangement according to claim 2, wherein the battery sensor is fastened, by way of a first of said resistance connections in a conducting manner and by way of a second of said resistance connections in an insulating manner, to a body of the clamp, and wherein a connection cable can be connected to the second of said resistance connections.

10. The battery sensor arrangement according to claim 2, wherein the electronic unit is connected with a temperature sensor which is arranged in a heat-conducting manner on a resistance connection or directly on a body of the clamp.

11. The battery sensor arrangement according to claim 2, wherein the electronic unit has a connector to which at least one supply cable to the other pole of the battery can be connected.

12. The battery sensor arrangement according to claim 2, wherein the electronic unit has a connector to which at least one communication line to other electronic equipment can be connected.

13. The battery sensor arrangement according to claim 2, wherein the electronic unit has a unit which determines at least one of a battery voltage, a battery current, and a battery temperature.

14. The battery sensor arrangement according to claim 13, and further comprising a resistance connection which has an interruption which can be closed by way of a power switch, wherein the power switch can be controlled by the unit which determines at least one of a battery voltage, a battery current, and a battery temperature.

* * * * *